(12) United States Patent
Raynal

(10) Patent No.: US 10,460,945 B2
(45) Date of Patent: Oct. 29, 2019

(54) MACHINE SUITABLE FOR PLATING A CAVITY OF A SEMI-CONDUCTIVE OR CONDUCTIVE SUBSTRATE SUCH AS A THROUGH VIA STRUCTURE

(71) Applicant: ALCHIMER, Massy (FR)

(72) Inventor: Frederic Raynal, Paris (FR)

(73) Assignee: ALCHIMER, Massy (FR)

(*) Notice: Subject to any disclaimer, the term of this patent is extended or adjusted under 35 U.S.C. 154(b) by 0 days.

(21) Appl. No.: 14/358,659

(22) PCT Filed: Nov. 19, 2012

(86) PCT No.: PCT/EP2012/072993
§ 371 (c)(1),
(2) Date: May 15, 2014

(87) PCT Pub. No.: WO2013/072525
PCT Pub. Date: May 23, 2013

(65) Prior Publication Data
US 2014/0318975 A1    Oct. 30, 2014

(30) Foreign Application Priority Data
Nov. 18, 2011 (FR) .................................... 11 03529

(51) Int. Cl.
*C25D 17/00* (2006.01)
*H01L 21/288* (2006.01)
(Continued)

(52) U.S. Cl.
CPC ...... *H01L 21/2885* (2013.01); *C23C 18/1632* (2013.01); *C23C 18/1653* (2013.01);
(Continued)

(58) Field of Classification Search
CPC .............................. C25D 17/001; C25D 17/06
See application file for complete search history.

(56) References Cited

U.S. PATENT DOCUMENTS

| | | | | |
|---|---|---|---|---|
| 4,081,347 A | * | 3/1978 | Becker ..................... | C25D 5/02 204/224 R |
| 6,077,412 A | * | 6/2000 | Ting ......................... | C25F 7/00 204/212 |

(Continued)

FOREIGN PATENT DOCUMENTS

| | | |
|---|---|---|
| JP | 2003-264159 A | 9/2003 |
| JP | 2006-128355 A | 5/2006 |
| JP | 2011-174140 A | 9/2011 |

*Primary Examiner* — Stefanie S Wittenberg
(74) *Attorney, Agent, or Firm* — Womble Bond Dickinson (US) LLP

(57) ABSTRACT

The invention relates to a machine (1) adapted to metallize a cavity of a semi-conductive or conductive substrate such as a structure of the through silicon via type, according to a metallization process comprising the steps consisting of:
a) depositing an insulating dielectric layer in the cavity,
b) depositing a barrier layer to diffusion of the filling metal,
c) filling the cavity by electrodeposition of metal, preferably copper, and
d) carrying out annealing of the substrate,
characterized in that it comprises a series of wet-processing modules (10-60) configured to conduct steps a), b) and c) by wet-processing in a chemical bath (B) and at least one additional module (70) adapted to conduct annealing step d) of the substrate (S) such that the machine (1) is capable of executing the entire metallization process of the cavity.

29 Claims, 4 Drawing Sheets

(51) Int. Cl.
*H01L 21/768* (2006.01)
*H01L 23/48* (2006.01)
*H01L 21/67* (2006.01)
*C25D 5/02* (2006.01)
*C25D 17/06* (2006.01)
*C23C 18/16* (2006.01)

(52) U.S. Cl.
CPC ............ *C25D 5/02* (2013.01); *C25D 17/001* (2013.01); *C25D 17/06* (2013.01); *H01L 21/6723* (2013.01); *H01L 21/76898* (2013.01); *H01L 23/481* (2013.01); *H01L 2924/0002* (2013.01)

(56) References Cited

U.S. PATENT DOCUMENTS

| | | | |
|---|---|---|---|
| 7,114,693 B1* | 10/2006 | Olgado | C25D 7/12 248/559 |
| 2003/0051995 A1* | 3/2003 | Nobata | C25D 17/02 204/199 |
| 2004/0188257 A1 | 9/2004 | Klocke et al. | |
| 2005/0158478 A1* | 7/2005 | Katsuoka | C23C 18/1619 427/437 |
| 2007/0111519 A1* | 5/2007 | Lubomirsky | C23C 18/1653 438/678 |
| 2010/0003808 A1 | 1/2010 | Mevellec et al. | |
| 2010/0228304 A1* | 9/2010 | Kriksunov | A61F 7/007 607/3 |
| 2010/0320609 A1* | 12/2010 | Mayer | H01L 21/2885 257/773 |

* cited by examiner

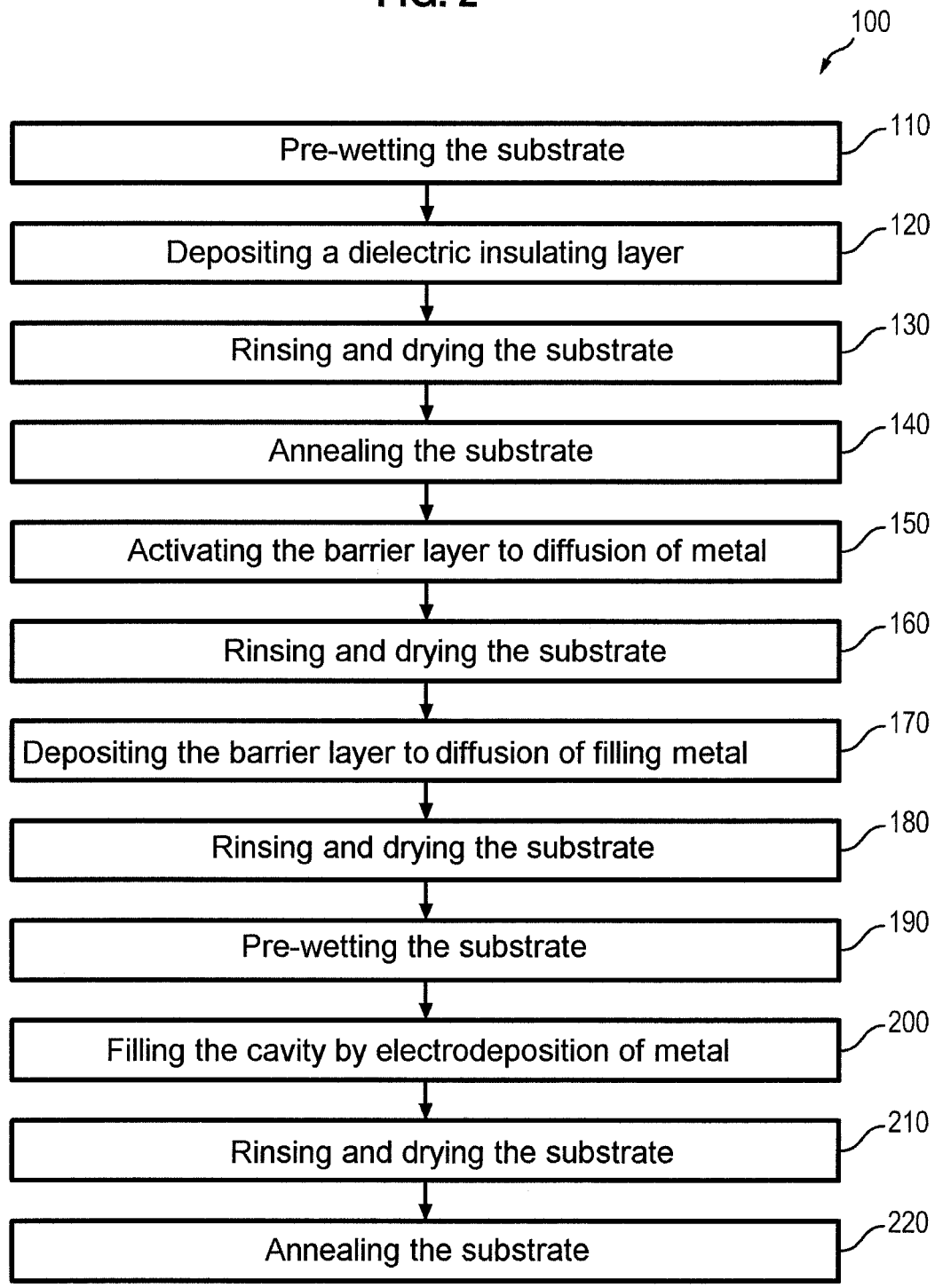

MACHINE SUITABLE FOR PLATING A CAVITY OF A SEMI-CONDUCTIVE OR CONDUCTIVE SUBSTRATE SUCH AS A THROUGH VIA STRUCTURE

The present invention generally relates to the manufacture of electronic devices such as in particular integrated circuits, especially in three dimensions, and a particular aim is a machine and a metallisation process of a cavity of a substrate semi-conductive or conductive of electricity, such as a structure of the through silicon via type.

The invention applies essentially in the field of microelectronics for metallisation especially by copper of through silicon vias (called «through silicon vias» or «through wafer vias» or «through wafer interconnect» in English), keystone of the integration of electronic chips (called «chip» or «die» in English) in three dimensions (3D) or vertical integration. It also applies to other fields of electronics where a substrate comprising through silicon vias must be electrically insulated and covered by a layer of copper. Examples in this context are the manufacture of interconnection elements in printed circuits (called «printed circuit board» or «printed wire board» in English) or that of passive elements such as inductances, or electromechanical elements in integrated circuits or microsystems (called «micro electro mechanical systems» in English).

Current electronic systems for the majority comprise several integrated circuits, or components, and each integrated circuit fills one or more functions. For example, a computer comprises at least one microprocessor and several memory circuits. Each integrated circuit usually corresponds to an electronic chip in its own housing (called «package» in English). The integrated circuits are soldered or plugged for example onto a printed circuit board (called «printed circuit board» or «PCB» in English) which ensures connection between the integrated circuits.

The permanent need to augment the functionality density of electronic systems has led to the concept called "integration in three dimensions" or "vertical integration" which is characterised by the fact that the chips are superposed and interconnected by vertical interconnections. The resulting stacking now comprises several layers or strata of active components or chips, and constitutes an integrated circuit in three dimensions (called «3D integrated circuit» or «3D IC» in English).

After stacking, for example by adhesion, the chips can be individually connected to the pins of the package by connecting wires. The interconnection of chips generally involves using through silicon vias.

Elementary technologies necessary for manufacturing integrated circuits in three dimensions comprise especially thinning of the silicon wafers (called "wafers" in English), alignment between the layers, adhesion of the layers, etching and metallisation of the through silicon vias within each layer.

Thinning of the silicon wafers can be done prior to manufacture of the through silicon vias (e.g. U.S. Pat. Nos. 7,060,624; 7,148,565).

Alternatively, etching and metallisation of the vias can be done prior to thinning of the silicon wafer (e.g. U.S. Pat. Nos. 7,060,624; 7,101,792). In this case, closed vias or «blind» vias (called «blind vias» in English) are etched in the silicon, then metallised to the preferred depth before the silicon wafer is thinned to produce through silicon vias.

Good electrical conductivity of copper and its high resistance to the phenomenon of electromigration, that is, the minimal migration of copper atoms under the effect of the density of electric current likely to be a significant cause of failure, make it in particular a material of choice for metallisation of through silicon vias.

Through silicon vias of 3D integrated circuits are generally made similarly to the «Damascene process» utilised in the field of microelectronics for the manufacture of interconnecting elements of integrated circuits, according to a succession of steps comprising:

etching of the vias in or across the silicon wafer;
deposit of an insulating dielectric layer;
deposit of a barrier layer to diffusion, or «liner», serving to prevent migration or diffusion of the filling metal, generally copper;
deposit of a germination layer of copper (thin layer of copper, «seed layer» in English) enabling filling of the via by copper despite the strong resistivity of the materials constituting the barrier layer to diffusion;
filling of the vias by electrodeposition of copper;
annealing of the substrate, and
elimination of the excess copper by mechanical-chemical polishing.

The insulating dielectric layer can be inorganic (generally comprising silicon oxide $SiO_2$, silicon nitride SiN or aluminium oxide, for example), deposited by CVD or other, or organic (parylene C N or D, polyimide, benzocyclobutene, polybenzoxazole, for example) deposited by soaking in liquid medium or SOG method (spinon-glass in English).

The barrier layer to diffusion of copper is generally constituted by tantalum (Ta), titanium (Ti), tantalum nitride (TaN), titanium nitride (TiN), titanium-tungsten alloy (TiW), tungsten nitride-carbide (WCN) or a combination of these materials, and generally deposited in vapour phase (PVD, CVD, ALD).

This barrier layer can be formed from other metals such as, in particular, an alloy based on nickel or cobalt by electroless processing.

The vias formed in this way are characterised by their shape factor («aspect ratio» in English), which defines the ratio between the depth and the diameter of the via. A noted form factor for example of 10:1 defines a via having a diameter of dimension ten times less than its depth.

The depositing steps of the barrier layer, germination, filling and annealing layer are commonly designated together by the expression «metallisation of through silicon vias».

Generally, the depositing steps of the insulating dielectric layer, of the barrier layer and of the germination layer are made by processes called «by dry process», by physical or chemical deposit in vapour phase (PVD or «Physical Vapor Deposition», and CVD or «Chemical Vapor Deposition» respectively), with the filling able as such to be completed by «wet process».

Generally, the deposit chemical in vapour phase (CVD) is currently preferred from the industrial viewpoint for making the insulating dielectric layer and the barrier layer to diffusion, with physical deposit not producing deposits sufficiently compliant over the entire depth of the via. The germination layer however is made rather by physical deposit in vapour phase, with problems of adhesion and carbon contamination, linked to organic precursors, being observed with deposits of the germination layer by CVD.

Metallisation of vias utilising these steps by dry process however has the drawback of being difficult to carry out, relatively costly due to their consumables and low yield. The PVD and CVD processes in fact require high vacuum conditions, high temperatures, use of precursors in gaseous phase or even the production of plasma.

Metallisation of a via according to this conventional method therefore requires several different machines to be run, generally 3 to 5, for depositing the insulating dielectric layer, the barrier layer to diffusion, the germination layer, the filling layer and the annealing layer. These machines are also bulky and the time required for metallising the vias is very long, due in part to transfer of the substrata between each machine.

Document US 2004/0188257 has proposed a lithography process on a substrate, during which a germination layer is deposited, then the substrate is rinsed and dried prior to exposing it to create a photosensitive layer, with everything wet-processed using a single machine. However, in this document, the machine does not metallise through silicon vias (or any other cavity of a semiconductive or conductive substrate). In effect, this machine enables only deposition of a germination layer in a cavity, whereas the metallisation process also requires prior deposit of a layer of insulation and a barrier layer. The machine described in this document is therefore absolutely not adapted for use in such a process.

An aim of the invention is therefore to propose a machine adapted to metallise a cavity of a semi-conductive substrate such as a structure of the through silicon via type, which is capable of performing all the metallisation steps rapidly and with a small footprint, and producing good-quality metallised vias at low cost in comparison with known metallisation processes by dry process.

Secondarily, another aim of the invention is to limit or even eliminate contact between chemical solutions and other harmful components and the operators.

For this, the invention proposes a machine adapted to metallise a cavity of a semi-conductive or conductive substrate such as a structure of the through silicon via type, according to a metallisation process comprising steps consisting of:

a) depositing an insulating dielectric layer in the cavity, b) depositing a barrier layer to diffusion of the filling metal, c) filling the cavity by electrodeposition of metal, preferably copper, and d) performing annealing of the substrate, characterised in that it comprises a series of wet-processing modules configured to conduct the steps a), b) and c) wet-processing in a chemical bath and at least one additional module adapted to conduct annealing step d) of the substrate such that the machine is capable of completing the entire metallisation process of the cavity.

Because it carries out metallisation of wet-processing vias (with the exception of annealing which is conducted by dry process) due to using adapted modules, the machine is therefore capable of performing all metallisation steps, and reducing the required footprint. The wet-processing deposit and filling modules do not in fact require the piece to be placed under vacuum or generation of plasma, and also produce vias having continuous deposit and compliant with a wide range of form factors and having excellent adhesion to the substrate.

Some preferred but non-limiting aspects of the machine according to the invention are the following:

the substrate comprises an active face on which the cavity is formed, and a rear face opposite the active face and each wet-processing module comprises a container designed to contain the chemical bath, at the bottom of which a support intended to receive the rear face of the substrate is arranged horizontally such that the active face of said substrate is oriented upwards in the direction opposite the bottom of the module.

Horizontal is understood here to mean a chemical bath substantially parallel to the bottom of the module.

In this way, it is possible to limit the volume of chemical bath B necessary for performing each step taking place via wet-processing, and therefore limiting the bulk of each module. In fact, since the semi-conductive substrate has its active face directed upwards, only a film of the solution chemical used for the chemical bath is necessary to perform the different steps of the process, whereas in comparison known machines lower the substrate active face down into the chemical bath B to protect the various connections, the consequence of which is use of a large-volume chemical bath to ensure complete soaking of the substrate and the use of highly complex monitoring devices of the evolution of chemical baths. The chemical bath Bs can also be reused such that the quantity of necessary consumables per semi-conductive substrate treated in the machine is reduced, and therefore the overall cost of the metallisation process by semi-conductive substrates. Finally, this limits monitoring of the process in general: in fact, given the low quantity of chemical solution used, it is possible to refresh the chemical bath more often than in cases of conventional wet-processing machines. The machine is therefore much less complex.

the support comprises arrangements for keeping the substrate in position during the metallisation process;

the support comprises protection adapted to protect the rear face of the substrate;

the arrangements and the protection are formed by at least one channel adapted to create a vacuum between the support and the substrate;

the container of the wet-processing modules comprises lateral walls substantially adjacent to the support so as to limit the internal volume of said container;

it comprises at least one annealing module of the substrate and in which the series of wet-processing modules includes:

at least one pre-wetting module of the substrate, at least one depositing module for depositing the insulating dielectric layer, at least one rinsing and drying module, at least one activation module for activating the barrier layer to diffusion, at least one depositing module for depositing the barrier layer to diffusion, and at least one filling module for filling by electrodeposition of metal;

it comprises at least six annealing modules of the substrate and in which the series of wet-processing modules includes:

at least two pre-wetting modules of the substrate, at least three depositing modules for depositing the insulating dielectric layer, at least one rinsing and drying module, at least one activation module for activating the barrier layer to diffusion, at least one depositing module for depositing the barrier layer to diffusion, at least eight filling modules for filling by electrodeposition of metal;

the pre-wetting, deposit of the insulating dielectric layer, rinsing and drying, activation, deposit of the barrier layer to diffusion and filling modules each comprise means adapted to vertically shift the substrate between a high position, in which the support is adjacent to an opening of the module to enable placement of the substrate on the support, and a low position, in which the support is lowered into the module so as to enable its wet-processing treatment;

the depositing modules for depositing the insulating dielectric layer, the activation modules of the barrier layer to diffusion, the depositing modules for depositing the barrier layer to diffusion and/or the filling modules further comprise a device for rinsing and drying of the substrate;

the device for rinsing and drying comprises an arm adapted to deposit rinsing fluid on the active face of the substrate;

the device for rinsing and drying further comprises a motor adapted to set the support in rotation about a central axis of said support and/or a nozzle adapted to send inert gas onto the substrate to dry the substrate;

the depositing modules for depositing the insulating dielectric layer, the activation modules of the barrier layer to diffusion, the depositing modules for depositing the barrier layer to diffusion and/or the filling modules are arranged in a receptacle adapted to receive the rinsing fluid during rotation of the support;

the pre-wetting, deposit of the insulating dielectric layer, activation, deposit of the barrier layer to diffusion and filling modules further comprise at least means adapted to permit at least partial evacuation of the chemical bath;

the means comprise a tube extending from a lid of the module adapted to at least partially aspirate the chemical bath, and/or a nozzle adapted to at least partially aspirate the chemical bath;

it further comprises a receptacle adapted to receive a cassette housing a plurality of substrata, and at least one robot to successively extract the substrata from the cassette and transfer them successively from one module to another to metallise at least one cavity of each of said substrata;

each annealing module comprises:
a container, at the bottom of which are arranged a plate forming a cold source and a plate forming a hot source intended to successively receive the substrate,
an internal robot configured to move the substrate from the cold source to the hot source, and inversely, and
means adapted to replace gas prevailing in the container by inert gas, and inversely;

each depositing module for depositing the insulating dielectric layer comprises:
a container designed to contain the chemical bath, here an electrolyte, at the bottom of which is arranged the support configured to receive the substrate,
an anode comprising inert metal and arranged in the container,
lighting comprising a source emitting light beams and means for spreading the light beams over the entire surface of the substrate so as to activate the surface of the substrate,
a power supply comprising connection means to the substrate and to the anode to polarise the surface of the substrate at an electric potential enabling electrochemical reaction, and
a sealing joint, adapted to insulate the power supply from the electrolyte.

each depositing module for depositing the insulating dielectric layer further comprises rotation means of the anode relative to the support;

each filling module comprises a motor adapted to set the support in rotation about a central axis of said support to evacuate part of the chemical bath;

each filling module is further adapted to deposit onto the barrier layer to diffusion a germination layer formed from the same metal as the filling layer;

each filling module comprises:
a container designed to contain the chemical bath, here an electrolyte, at the bottom of which is arranged the support configured to receive the substrate,
an anode, comprising inert metal or metal identical to that which is deposited during the filling of the cavity,
a power supply comprising connection means to the barrier diffusion layer and to the anode to polarise the surface of the barrier diffusion layer at an electric potential enabling electrochemical reaction, and
a sealing joint, adapted to insulate the power supply from the electrolyte;

each filling module further comprises rotation means of the anode relative to the support;

each activation module and/or each depositing module for depositing the barrier layer to diffusion comprises:
a container designed to contain the chemical bath, at the bottom of which is arranged the support configured to receive the substrate,
first heating, adapted to heat the substrate to a temperature of the order of 50° C. to 80° C., preferably 65° C., said first heating able to be constituted by the support configured to receive the substrate, and/or second heating, adapted to heat the chemical bath active insertion in the container to a temperature of the order of 50° C. to 80° C., preferably 65° C.,
an ultrasonic or megasonic transmitter, and
a sealing joint, adapted to insulate a peripheral zone of the substrate from the chemical bath; and each pre-wetting module comprises:
a container designed to contain the chemical bath, here deionised water, at the bottom of which is arranged the support configured to receive the substrate, and
a pump adapted to create a vacuum in the container.

According to a second aspect, the invention also proposes a metallisation process of a cavity of a semi-conductive or conductive substrate such as a structure of the through silicon via type, comprising the steps consisting of:
a) depositing an insulating dielectric layer,
b) depositing a barrier layer to diffusion of the filling metal,
c) filling the cavity by electrodeposition of metal, preferably copper, and
d) performing annealing of the substrate,
characterised in that said steps are carried out entirely with a machine according to the invention.

Some preferred but non-limiting aspects of the process according to the invention are the following:
it comprises successively the following sub-steps:
(i) pre-wetting of the substrate,
(ii) deposit of an insulating dielectric layer,
(iii) rinsing and drying of the substrate,
(iv) annealing of the substrate,
(v) activation of the barrier layer to diffusion of the metal,
(vi) rinsing and drying of the substrate,
(vii) deposit of the barrier layer to diffusion of the filling metal,
(viii) rinsing and drying of the substrate,
(ix) pre-wetting of the substrate,
(x) filling of the cavity by electrodeposition of the metal,
(xi) rinsing and drying of the substrate, and
(xii) annealing of the substrate;

it further comprises an annealing step of the substrate between the rinsing and drying step of the substrate (viii) and the pre-wetting step of the substrate (ix);

the rinsing and drying steps of the substrate (iii), (vi) and/or (viii) are carried out in the same module as the depositing (ii), activation (v) and/or deposit steps (vii) respectively.

at the start of each step (i), (ii), (iv), (v), (vii), and (ix), the substrate is fixed on a support arranged in the module corresponding to said step by means of a robot;

following fixing of the substrate onto the support, the process further comprises a step during which the support is lowered into the module and the module is closed; and on completion of each step (i), (ii), (iv), (v), (vii), and (ix), the module is opened and the support is removed such that the support is now adjacent to the opening of the module so that the robot can extract the support from the module.

Other characteristics, aims and advantages of the present invention will emerge more clearly from the following detailed description, given in reference to the attached figures given by way of non-limiting example and in which:

FIG. 2 is an organigram representing different steps of a metallisation process according to the invention, FIG. 3 generally illustrates a wet-processing module of the machine of FIGS. 1a and 1b.

Figure 1A:
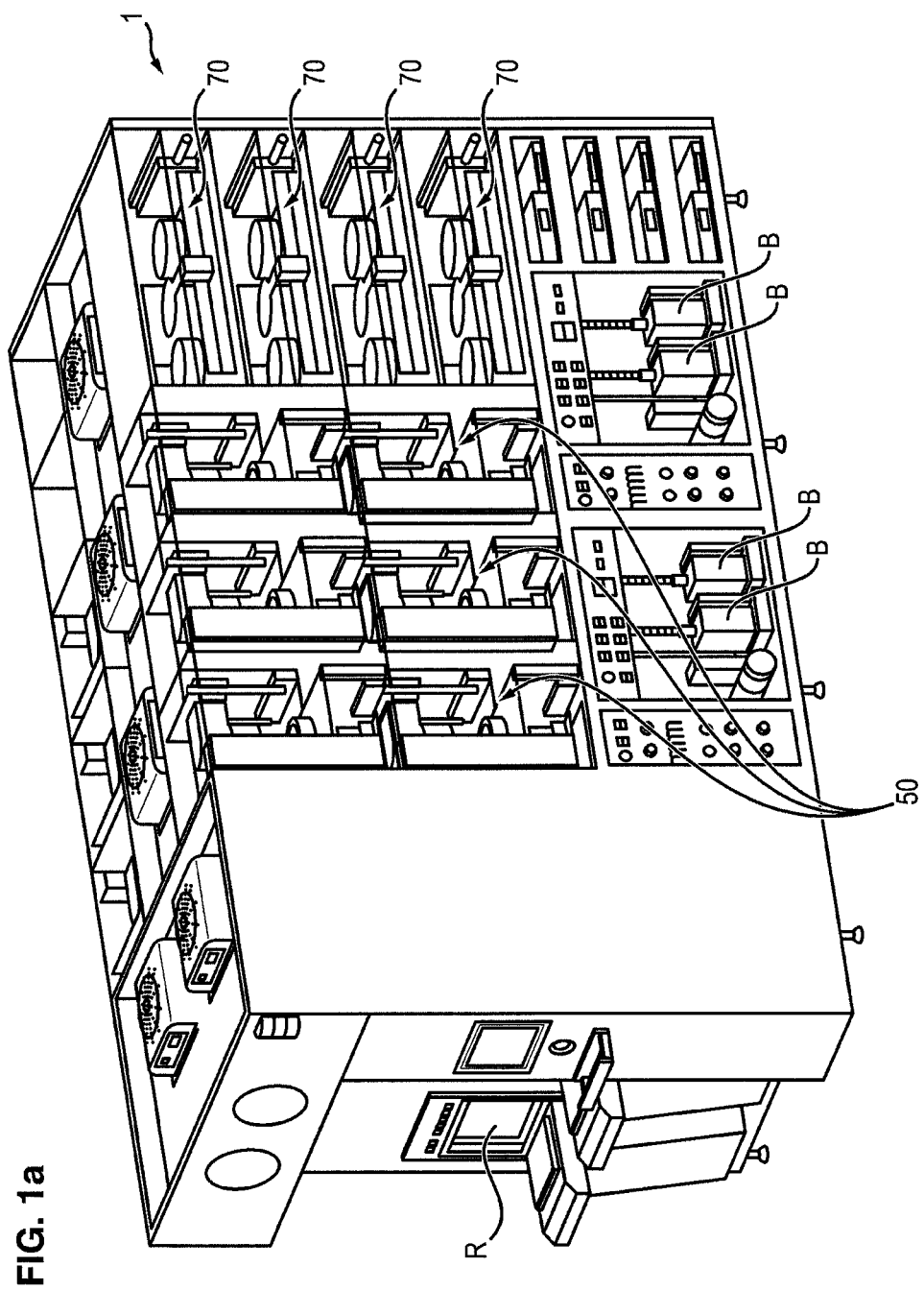
FIGS. 1a and 1b illustrate respectively a general perspective view and a sectional view of an example of a machine according to the invention.
Figure 1B:
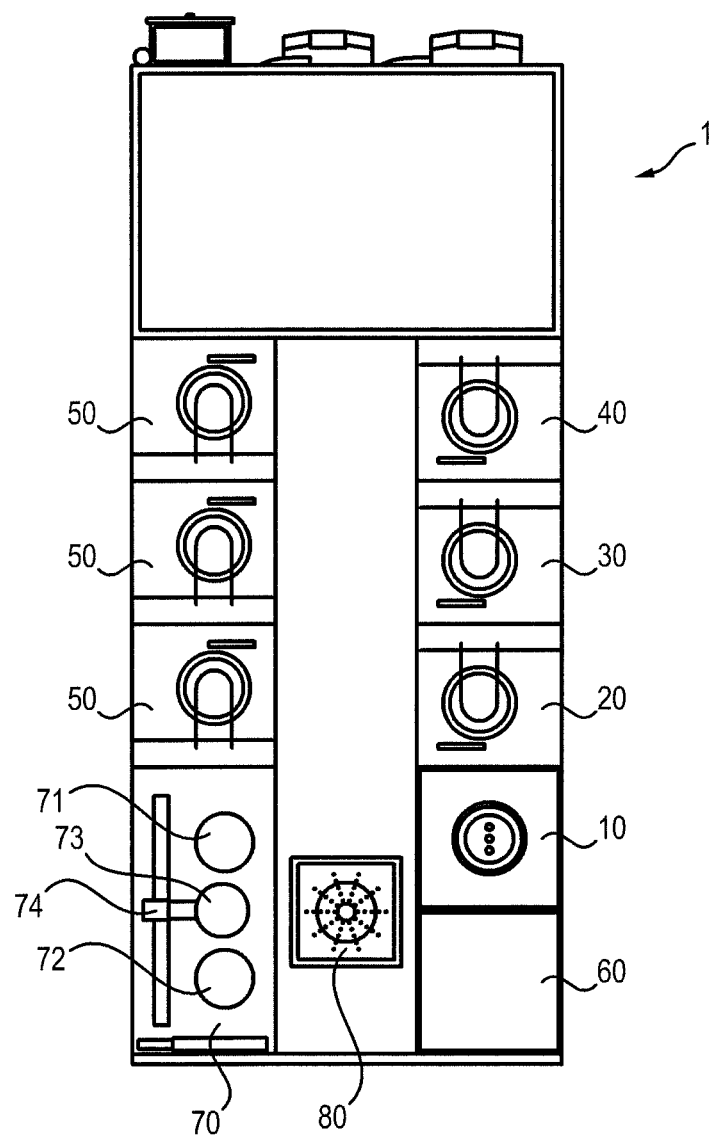
Figure 3:
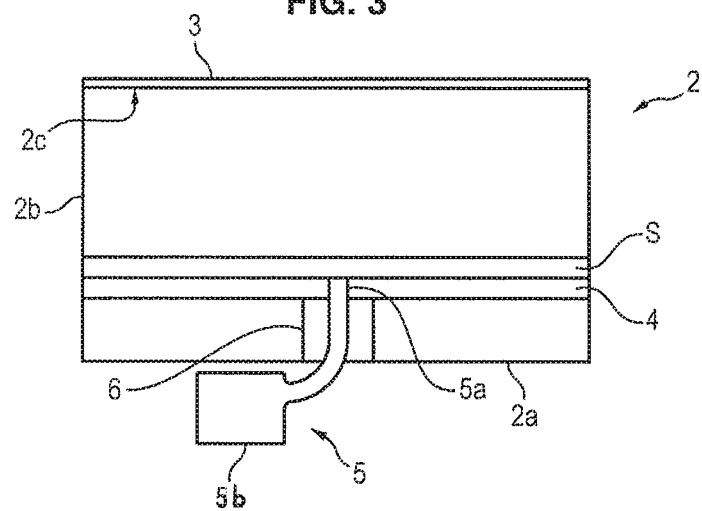
Figure 4:
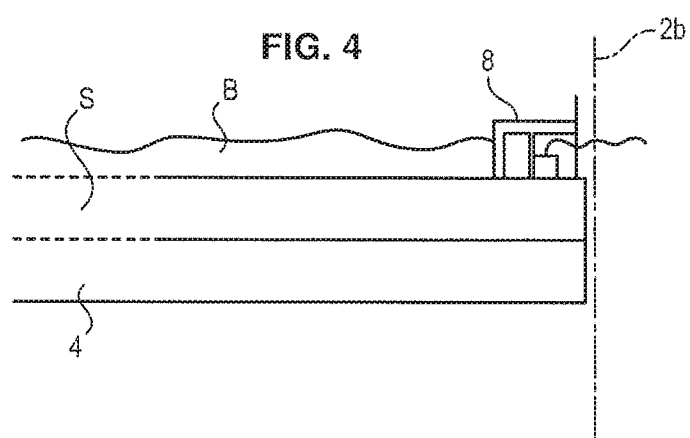
FIG. 4 illustrates a detailed view of an example of connections of a depositing module for depositing an insulating dielectric layer or filling layer.

A machine for metallisation of a cavity, for example a via, a semi-conductive substrate S according to the invention, will now be described.

The substrate S can for example be a silicon plate of 200 mm to 300 mm in diameter, having at least one via.

In the following, it can be implemented in particular for metallisation of a via according to the process described in document FR 2 933 425 and in the application FR 10 54668 in the name of the applicant. The result is a conductive or semi-conductive substrate S in which vias are made, covered by an insulating dielectric layer, a barrier layer to diffusion and a germination layer. It remains only to fill the vias by electrodeposition, then perform annealing of the ensemble.

However this is not limiting, and other metallisation processes of cavities of a wet-processing conductive or semi-conductive substrate S can be used for the deposit of layers of electric insulation, a barrier to diffusion and germination.

In addition, it is evident that such a machine is adapted to be used preferably in a clean room conforming to current standards for manufacturing components such as produced by the micro-electronics industry.

A machine according to the invention comprises a series of modules configured for depositing dielectric insulating and barrier layers and wet-processing filling of the cavity in a chemical bath B, and at least one module adapted to carry out annealing of the semi-conductive substrate S.

More precisely, the machine can comprise:
at least one pre-wetting module 10 of the substrate S,
at least one depositing module for depositing the insulating dielectric layer 20,
at least one rinsing and drying module 60,
at least one activation module for activating the barrier layer to diffusion of the filling metal 30,
at least one depositing module for depositing the barrier layer to diffusion 40,
at least one filling module 50 for filling by electrodeposition of the metal, preferably copper, and
at least one annealing module 70 of the substrate S.
Given the speed of each of these steps, the latter can preferably comprise to optimise the output of the machine:
two pre-wetting modules 10 of the substrate S,
three depositing modules for depositing the insulating dielectric layer 20,
a rinsing and drying module 60,
an activation module for activating the barrier layer to diffusion of the filling metal 30,
a depositing module for depositing the barrier layer to diffusion 40,
eight filling modules 50 for filling by electrodeposition of the metal, preferably copper, and
six annealing modules 70 of the substrate S, or 22 modules, its yield then metallising at least ten substrata S per hour.

It is understood that the machine 1 which forms the object of the invention is capable of performing all the metallisation steps. Nevertheless, it is possible to perform only some of these steps, for example starting from a substrate S having vias on which a layer of dielectric deposited by dry process, for example a layer of $SiO_2$, has already been deposited, or even a barrier layer to diffusion of the filling metal (generally copper), as needed.

In addition, since the machine 1 comprises distinct modules, it can also function without the modules for making the layers insulating dielectric or even without the modules for making the barrier diffusion layer, without as such departing from the spirit of the invention.

In keeping with the invention, only the annealing module 70 of the substrate S functions via dry process, the other being adapted to take wet-processing steps.

In particular, the wet-processing deposit modules, specifically the pre-wetting modules 10, of the insulating dielectric 20 and barrier to diffusion 40 layers, activation of the barrier 30 and filling modules 50, comprise a container 2 having a bottom 2a, lateral walls 2b and an opening 2c closed by a lid 3. In this case, the walls 2b are represented overall as cylindrical, though this is not limiting.

The container 2 is designed to contain the chemical bath B and all the connections and means specific to each module. It further comprises a support 4 («stage» in English), configured to receive and keep the substrate S in position during the corresponding step of the metallisation process. The support 4 is arranged parallel to the bottom 2a of the container 2, in an overall horizontal position.

For example, the support 4 is equipped with aspiration means 5, adapted to create a vacuum with a face of the substrate S so as to keep it in position. Such aspiration means can especially have the form of one or more through channels 5a, whereof a first end is connected to a vacuum pump 5b whereas their second end terminates at the surface of the support 4 configured to receive the substrate S, for example in a central zone of the latter.

Advantageously, the substrate S (which has an active face on which the via(s) terminate, which is adapted to receive the different metallisation layers, and a rear face opposite the active face) is set on the support 4 in such a way that its active face is oriented upwards, in the direction opposite the bottom 2a of the container 2.

It is therefore the rear face of the substrate S which is in contact with the support 4.

This particular choice of the orientation of the substrate S in the container 2 both limits the quantity of consumables used, and therefore the total cost of metallisation per substrate S treated, as well as the footprint of the machine relative to the event where the substrate S is presented active face to the support 4.

In fact, in the case of conventional wet-processing cells, where the substrate S is presented with its active face oriented downwards or oriented vertically and plunged in this position into the chemical bath B to complete the corresponding step, a greater volume of chemical bath B is necessary if the aim is to ensure that the whole substrate S is wet by the chemical bath B. So, if the modules were arranged to receive the substrate S active face downwards, as for conventional cells, the quantity of consumables used would have been too great for the machine to be profitable relative to machines known today, and the monitoring of baths would have been much more complex to undertake.

In comparison, here, the specific upward orientation of the active face of the substrate S, in the direction of the opening of the container 2, limits the chemical bath B to a fine film on the active face since it extends horizontally, while guaranteeing adequate wetting to complete the subsequent wet-processing steps of the metallisation process.

To further optimise the volume of solution used, the dimensions of the container 2 are adapted so as to limit the volume necessary for covering the active face of the substrate S. For this, the walls of the container 2 can for example be adjusted to the dimensions of the substrate S so as to leave only a small space between the wafer of the substrate S and the container 2. The container 2 of each module is therefore chosen preferably such that it is sufficiently large to be able to both contain the support 4, a substrate S, the connections and the chemical bath B associated with the corresponding step of the metallisation process (e. g. electric contacts, a sealing joint, an ultrasound transmitter, an electrolyte, etc.) and being reduced to the necessary minimum to limit the overall footprint of the machine as well as the quantity of consumables used.

For example, for a substrate S formed by a silicon plate of around 200 mm in diameter, it is possible to use between 1 L and 1.5 L of deionised water and 60 mL to 300 mL of chemical baths B only per silicon plate by adjusting the internal dimensions of the container 2 to the dimensions of the treated plates, and this without necessarily monitoring the chemical baths B.

This particular choice of orientation of the substrate S on the support 4 was not evident however in light of the different steps taken during wet-processing metallisation. These in fact require a whole connection, which will be evident in greater detail throughout this description, generally connected to the periphery of the substrate S and at all costs having to be protected from the chemical bath B under penalty of damage for smooth functioning of the process.

Also, the chemical baths B used during the different steps of metallisation of vias are generally reusable several times. To this effect, it is recalled that conventional cells generally comprise a whole series of means for monitoring chemical baths B for taking predetermined measuring parameters (pH, quantities of a given chemical substance, etc.), to follow their evolution and as needed adjust the chemical bath B by adding extra products, or replace them with a fresh chemical bath B.

It is in fact necessary to optimise the number of cycles of use of the chemical baths B to limit the quantity of consumables per substrate S to reduce costs.

But in this case, as evident hereinabove, the volume of the chemical bath B can be reduced considerably by positioning the rear face of the substrate S on the support 4. Consequently, monitoring of the chemical baths B can be greatly simplified, to the extent where the chemical baths B can be renewed more often without the overall cost per substrate S being really affected. For example, in the example described previously, for all the 22 wet-processing modules, only a few physical parameters are monitored, such as pH, temperature or the rates of the chemical baths B. In addition, this monitoring can be done regardless online, that is, by monitors arranged directly in the machine, or offline, in a laboratory.

To this effect, since the machine is made in the form of distinct modules, samples can also be taken at the level of each module, of the bath feed of said modules, of the cans containing the chemical baths B intended to be used during the metallisation process and/or intermediate tanks in which the mixtures of the different solutions to obtain the chemical bath B are made.

As a variant, the chemical baths B can be systematically renewed on completion of a determined number of cycles as a function of the type of bath used. Typically, in the pre-wetting module, the deionised water is refreshed after each cycle, whereas in the activation module the chemical bath B is refreshed roughly every ten cycles. The machine is therefore much simpler than a machine comprising a complex system for monitoring baths, if necessary allowing offline monitoring by sampling at different sites of the machine.

Another advantage of the upwards positioning of the active face is that the support 4 can protect the rear face from contamination by the chemical bath B.

Embodiments of the modules forming a machine according to the invention will now be described. An example substrate S is a silicon plate comprising a series of vias. The support 4 has substantially identical form and dimensions so as to limit the footprint of the module and protect the entire rear face of the plate. This however is not limiting and other types of substrata S can be envisaged.

In general, and as evident earlier, each of the modules comprises a container 2, formed by a bottom 2a, lateral walls 2b and an opening closed by a lid 3, at the bottom 2a of which is arranged the support 4 intended to receive and keep the substrate S in position.

Advantageously, the support 4 of the wet-processing modules comprises means 6 adapted to vertically shift the support 4 between a first position, known as low, which is adjacent to the bottom 2a of the container 2 and in which the step associated with the metallisation process takes place, and a second position, known as high, which is adjacent to the opening of the module and in which the substrate S is especially positioned on the support 4 then removed therefrom, preferably automated by a robot 80.

The aim of the pre-wetting module 10 is to force deionised water to enter the via to enable its subsequent coating by the insulation layer. For this, it comprises a source of water, preferably deionised, connected to means configured to introduce the water to the container 2, as well as a pump adapted to vacuum the substrate S, typically at a pressure of the order of 1 to 10 mbar.

The depositing module for depositing the insulating dielectric layer 20 as such comprises an anode arranged in the container 2, lighting comprising a source emitting light beams and means for spreading the light beams over the entire surface of the substrate S so as to activate the surface of the substrate S, and a device for electrical contact 7 physically insulated from the chemical bath B, which is here an electrolyte.

The anode preferably comprises inert metal (titanium covered by platinum, for example), and can be mounted in rotation relative to the support 4 so as to travel the periphery of the substrate S during rotation. Here, in the case of a circular plate, the anode is therefore mounted in rotation about the axis of symmetry of the plate and of the support 4.

For example, the anode, the lighting and the power supply of the deposit module can comply with the module described in document FR 2 943 688 in the name of the applicant.

In addition, the device for electrical contact has connection means 7 to the substrate S and to the anode to polarise the surface of the substrate S at an electric potential enabling electrochemical reaction, and is insulated from the electrolyte by a sealing joint 8. These can especially be electrical contacts 7 of annular shape discontinuous along the periphery of the substrate S so as to provide supply to the substrate S at several points of contact arranged uniformly on the latter. These contacts 7 are also protected all along the periphery of the substrate S by a toroidal sealing joint 8, insulating the contacts from the electrolyte while allowing them to connect to a power supply. The radial extent of the toroidal joint 8 (relative to the periphery of the substrate) is preferably of the order of around 2 to 4 mm.

In this way and due especially to the sealing joint, this configuration of the module therefore ensures positioning of the substrate S on the support 4 with its active face up, without risking damage to the electrical connection 7.

Finally, the electrolyte B, which comprises at least two chemical solutions, is made upstream of the module, in a mixer, before being introduced to the module. For example, the machine 1 can comprise a system of pumps and dosers adapted to sample the necessary quantities of each of the solutions in specific barrels B and introduce them to the mixer which mixes them according to a predefined ratio to obtain the electrolyte B used for depositing the insulating dielectric layer, prior to introducing it to the container 2.

The activation module 30 and the depositing module for depositing the barrier diffusion layer to the filling metal 40 comprise means adapted to heat the substrate S and/or the chemical bath B to a temperature between 50° C. and 80° c., preferably of the order of 65° C., an ultrasonic or megasonic transmitter, and a sealing joint. Reference could especially be made to the applications WO 2011/039310 and WO 2011/029860 in the name of the applicant for more details.

According to a preferred embodiment, the substrate S is heated directly to the wanted temperature by the support 4 on which it is arranged, and the chemical bath B is heated prior to its introduction to the container 2.

In addition, the aim of the sealing joint is to insulate a peripheral zone of the substrate S, on a radial extent of the order of 2 to 4 mm.

Again, the chemical bath B can comprise at least two different chemical solutions, such that the module is connected upstream to an associated mixer, adapted to mix the solutions prior to their introduction to the module.

Each of the depositing modules for depositing the insulating dielectric layer 20, activation of the barrier to diffusion of the filling metal layer 30 and deposit of said barrier layer 40 can further comprise means for rinsing and drying of the substrate S. For this, the module further comprises an external vat enclosing the container 2, at least one nozzle adapted to send rinsing fluid, here deionised water, to the substrate S and means adapted to set the support 4 in rotation about the axis of symmetry of the latter.

The nozzle adapted to send the deionised water to the substrate S can for example be fixed on an arm mounted in rotation relative to the module, and adapted to send distilled water to a central zone of the substrate S.

In this way, when the step of the metallisation process is completed in the module, the lid 3 of the module opens and the support 4 is brought to the high position. The water is then sent to the substrate S to rinse it, then the substrate S is set in rotation to evacuate water and dry the substrate S.

The support 4 can optionally be set in rotation a first time to carry out rinsing with water so as to evacuate the bath residue present on the surface of the substrate S in the tub.

In addition, according to a preferred embodiment, the substrate S and optionally the support 4 protrude out of the container 2 in a high position to make evacuation of water in the tub easier.

The filling module for filling by electrodeposition of metal, preferably copper, comprises as such an anode arranged in the container 2 and a device for putting in electrical contact physically insulated from the chemical bath B, which is an electrolyte here The anode preferably comprises inert metal or metal identical to the deposited metal (here copper) and can be mounted in rotation relative to the support 4 so as to travel the periphery of the substrate S during rotation. Here, in the case of a circular plate, the anode is therefore mounted in rotation about the axis of symmetry of the plate and of the support 4.

In addition, the device for electrical contact can be identical to that of the depositing module for depositing the insulating dielectric layer, and has connection means to the substrate S and to the anode to polarise the surface of the barrier diffusion layer to the copper at an electric potential enabling electrochemical reaction. It is also insulated from the electrolyte by a sealing joint which can be toroidal as described previously, forming an annular channel about electrical contacts and extending over a radial distance of the order of around 3 to 5 mm.

The filling module is adapted to deposit the germination layer and the filling layer of the via. As a variant, and as detailed in the application FR 10 54668 deposited on Jun. 11 2010 in the name of the applicant, the module is also adapted to fill the via by copper electrodeposition without previous deposit of the germination layer. Reference could be made to this application for more details concerning the process and the module itself.

In addition, the filling module can further comprise drying means adapted to set the support 4 in rotation about the axis of symmetry of the latter, as well as an external tub enclosing the container 2. In this way, on completion of the filling step, the lid 3 of the module opens and the support 4 is taken to a high position. The substrate S is then set in rotation to evacuate the electrolyte residue before being sent to the following module.

Optionally, the filling module can also comprise rinsing means as described earlier. This is not however obligatory, to the extent where the substrate S is then sent to the rinsing and drying module.

So that the chemical bath B can be reused several times and any contact between the electrochemical bath and the different connections connected to the substrate S (and especially devices for electrical contact) can be avoided, the modules for pre-wetting, deposit of the insulating dielectric layer, activation of the barrier layer to diffusion of the metal, deposit of the barrier layer to diffusion of the metal and filling further comprise at least evacuation means adapted to allow at least partial evacuation of the chemical bath B.

In fact, even if the support 4 is placed in a high position before being gripped for example by the pincers of a robot 80, a film of the chemical bath B remains on the surface of the substrate S. Due to the wettability of the chemical bath B, it is nevertheless very difficult to withdraw the connections from the substrate S without risking wetting them with the bath.

The evacuation means comprise for example a tube extending from a lid 3 of the module and adapted to at least partially aspirate the chemical bath B. The tube can for example be mounted mobile in the lid 3 between a retracted position, in which the tube is retracted towards the lid 3 and does not hinder handling of the substrate S or the metallisation process, and an aspiration position, in which the free end of the tube is brought towards the active face of the substrate S while the latter is now in a low position, a short distance from the latter (of the order of 0.1 mm to 3 mm) to aspirate a maximum from the chemical bath B without as such blocking the tube. The tube is then capable of aspirating a majority of the chemical bath B either for reuse or for replacement by a new bath.

As a variant, the evacuation means can also comprise a nozzle adapted to at least partially aspirate the chemical bath B. The nozzle can for example be fixed on the free end of an arm mounted to pivot on the module.

In all cases, only one very fine film, of the order of 0.3 mm to 3 mm thick, remains on the substrate S. Yet, the surface tension between the fine film of chemical bath B remaining and the substrate S withdraws the connections without risking contaminating them.

It is evident that, when the substrate S is plunged active face downwards into the chemical bath B, as is the case for conventional machines, the problem associated with disconnection of the connections does not arise. In fact, the substrate S is taken out directly with the connection.

The rinsing and drying module comprises a supply of rinsing fluid, here deionised water, adapted to feed a nozzle adapted to send the deionised water to the substrate S and means adapted to set the support 4 in rotation about the axis of symmetry of the latter.

The nozzle can for example be fixed on the free end of an arm mounted in rotation on the module.

The module further comprises a nozzle adapted to send inert gas, generally nitrogen, to the active face of the substrate S to enable complete drying of its surface.

Finally, the annealing module 70 conventionally comprises a plate forming a cold source 71 («cold plate» in English) and a plate forming a hot source 72 («hot plate» in English), adapted to receive the rear face of the substrate S, as well as an internal robot 70 adapted to transfer the substrate S from one plate to the other, and means allowing adapted means 74 to replace gas prevailing in the container 2 with inert gas, and inversely.

In operation, the internal robot 73 grips the substrate S preferably by the wafer and places it into the annealing module 70, on the plate forming a cold source 71. The container 2 is then closed, and the atmosphere replaced by inert gas. The internal robot 73 then places the substrate S on a plate forming a hot source 72 and leaves it to anneal for a determined period, generally a few minutes. Finally, the robot 73 repositions the substrate S on the plate forming a cold source 71 for a determined period, generally a few minutes, the inert atmosphere is evacuated and the module 70 is opened.

According to a preferred embodiment, the machine 1 is exhausted, that is, all gases are evacuated out of the clean room via a tubing system so as to prevent any exposure to operators.

In addition, the machine 1 is adapted to automate all the steps of the metallisation process 100 to limit, or even eliminate, any risk of contact between the operator and the chemical baths B or the substrate S.

For this, the machine 1 can for example comprise a receptacle R adapted to receive a cassette (not visible in the figures) housing a plurality of substrata S, and at least one robot to successively extract the substrata S from the cassette and transfer them successively from one module to another to carry out the metallisation steps of vias of each of said semi-conductive substrata S.

To make it easier to transfer the substrata S between the modules between each step of the metallisation process 100, the robot 80 can comprise for example pincers, having a plane surface and adapted to grip the substrate S by its lower face as per a spatula. The latter can also be fitted with fixing means, such as nozzles adapted to create a vacuum to ensure that the substrate S is held firmly on the pincers.

In addition, it is evident that the placement in a high position of the support 4s of the modules makes for correct positioning of the substrate S on the support 4s by pincers.

Finally, the modules can be arranged on either side of a rail, on which the robot 80 is capable of moving, and be distributed on at least two stages to reduce the footprint of the machine.

A machine according to the invention can have dimensions of the order of 2 m×5 m for 3 m in height.

A metallisation process of a cavity of a semi-conductive or conductive substrate S such as a structure of the through silicon via type according to the invention will now be described.

A process according to the invention comprises the steps consisting of:
a) depositing an insulating dielectric layer,
b) depositing a barrier layer to diffusion of the filling metal,
c) filling the cavity by electrodeposition of metal, preferably copper, and
d) performing annealing of the substrate S.

These steps are preferably all conducted by means of a machine according to the invention. However, it is possible to perform only steps b), c) and d), or as needed c) and d), if the substrate S already comprises an insulating dielectric layer, or an insulating dielectric layer and a barrier layer to diffusion of the metal.

More precisely, the process 100 can comprise the following steps:
(i) pre-wetting the substrate S 110,
(ii) depositing an insulating dielectric layer 120,
(iii) rinsing and drying the substrate S 130,
(iv) annealing the substrate S 140,
(v) activating the barrier layer to diffusion of the metal 150,
(vi) rinsing and drying the substrate S 160,
(vii) depositing the barrier layer to diffusion of the filling metal 170,
(viii) rinsing and drying the substrate S 180,
(ix) pre-wetting the substrate S 190,
(x) filling the cavity by electrodeposition of metal 200,
(xi) rinsing and drying the substrate S 210, and
(xii) annealing the substrate S 220.

The process can further comprise an additional annealing step of the substrate S between the rinsing and drying step of the substrate S 180 and the pre-wetting step of the substrate S 190.

In addition, as indicated previously, the rinsing and drying steps of the substrate S 130, 160 and/or 180 can be done in the same module as the steps for depositing 120, activation of the barrier layer to diffusion of the metal 150 and/or deposit 170 respectively.

The process 100 can be carried out as follows.

During a first step, an operator places a cassette comprising a plurality of substrata S, for example 25 silicon plates, in the receptacle R.

The rest of the process 100 can be entirely automated without intervention of the operator.

The cassette is opened according to usual means and the robot 80 grips a plate to take it to the pre-wetting module 10.

The pre-wetting module 10 is preferably opened and its support 4 is in a high position to enable insertion and positioning of the plate on the support 4. Advantageously, the robot 80 centres the plate on the support 4.

The support 4 then fixes the plate, for example by creating a vacuum, so as to protect its rear face and ensure that it is kept in position in the module 10, prior to being taken to a low position in the module 10.

Next, the module 10 is closed by the lid 3, 5 and the pre-wetting step 110 can take place.

On completion of the step, the deionised water is aspirated. For this, according to an embodiment, the tube is taken down off the lid 3 such that its free end is now adjacent to the active face of the plate, at a distance of the order of 0.1 mm to 3 mm, and the deionised water is aspirated. The tube is then retracted into the lid 3, and the module 10 opened.

The support 4 is raised back into a high position, preferably above the opening and protrudes out of the container 2, and the plate undergoes a drying step by rotation of the support 4 about its axis of symmetry.

Finally, the support 4 releases the plate, and the robot 80 can look for it and transfer it to the depositing module for depositing the insulating dielectric layer.

During a second step, the machine deposits the insulating dielectric layer 120.

For this, the robot 80 positions the plate on the support 4, which fixes it in position, before being taken to a low position at the bottom 2a of the module, as indicated earlier. The depositing module for depositing the insulating dielectric layer is then closed by the lid 3 and the deposit step of the insulating dielectric layer can take place.

This step 120 is described in detail in document FR 2 943 688 in the name of the applicant and therefore will not be described in further detail here.

On completion of the step, the chemical bath B is aspirated for reuse or replacement, for example because of the tube, as described previously.

The connections (i.e. the devices for electrical contact especially) can then be disconnected from the support 4.

The support 4 is raised back into a high position, preferably above the opening, and the plate undergoes a rinsing and drying step 130. For this, the nozzle is taken above the plate, preferably in a central zone thereof, and sends deionised water (or other rinsing fluid) to the plate. This is then set in rotation so as to evacuate the deionised water in the external tub and dry the plate.

By way of option, the support 4 can already be set in rotation a first time before rinsing with water to evacuate the bath residue present at the surface of the substrate S in the tub.

Finally, the support 4 releases the plate, and the robot 80 can now grip the plate and transfer it to the annealing module 70.

The robot 80 then offers the plate to the internal robot 73 which grips it by the wafer and places it into the annealing module 70, on the plate forming a cold source 71. Then, as indicated earlier, the container 2 is closed, the atmosphere replaced by inert gas, and the internal robot 73 places the plate on the plate forming a hot source 72 and leaves it to heat 140 for a determined period, generally a few minutes. Finally, the internal robot 73 repositions the substrate S on the plate forming a cold source 71, the inert atmosphere is evacuated and the module 70 is reopened. The internal robot can then grip the plate and hand it to the robot 80 which grips it and transfers it to the activation module for activating the barrier layer to diffusion of the metal 30.

The activation module for activating the barrier layer to diffusion of the metal operates similarly to the depositing module for depositing the insulating dielectric layer 20, with the exception of the processing step itself, during which the surface is activated in light of the subsequent deposit of the barrier layer to diffusion 40.

On completion of the processing step 150, the plate is also rinsed and dried, as described previously.

The robot 80 transfer the plate to the depositing module for depositing the barrier layer to diffusion of the metal, which also operates similarly to the depositing module for depositing the insulating dielectric layer, with the exception of the processing step itself, during which the barrier layer is deposited, for example in keeping with the description of applications WO 2011/039310 and WO 2011/029860, then the plate is rinsed and dried as described previously.

The robot 80 then transfers the plate to the pre-wetting module, where it undergoes pre-wetting identical to what has been described previously, before being transferred by the robot 80 to the filling module.

The filling module also operates similarly to the depositing module for depositing the insulating dielectric layer, with the exception of the processing step itself, during which the via is filled by electrodeposition, with or without previous deposit of a germination layer, for example as per application FR 10 54668 registered on Jun. 11 2010 in the name of the applicant.

However, it is evident that the final rinsing and drying step is optional. In particular, according to a preferred embodiment only one drying step by rotation of the support 4 about its axis of symmetry when the latter is returned to the high position can be conducted.

The robot 80 then transfers the plate to the rinsing and drying module.

The rinsing and drying module is preferably opened and its support 4 is in the high position. The robot 80 positions the plate on the support 4 which fixes it in position, before being taken to the low position in the module, as indicated earlier. Optionally, the rinsing and drying module can be closed by the lid 3 and the rinsing and drying step can take place.

During this step, the nozzle is taken, for example by the arm, above the plate, and sends rinsing fluid, here deionised water, to the active face of the plate. The plate is then set in rotation about the axis of symmetry of the support 4 to evacuate water. Finally, another nozzle is taken above the plate and sends inert gas, nitrogen for example, to the active face of the plate, preferably to the middle thereof.

On completion of the step, the support 4 is raised back to the high position and frees the plate to allow the robot 80 to grip it to then transfer it to the annealing module.

The annealing module then carries out annealing of the plate, as described earlier.

Finally, the robot 80 grips the plate in the annealing module and replaces it in the cassette, or in a new cassette, as needed.

The complete metallisation process lasts overall between 1 h and 2 h per plate and consumes around 1.2 L of chemical baths B.

In comparison, a grouped treatment process (per «batch» in English), consisting of wet-processing forming some of the layers on the substrate S (in particular the barrier diffusion layer to filling metal especially) also rapidly produces partially metallised substrata S. Nevertheless, they cannot be applied to all the steps of the metallisation process, as it is not possible to conduct the steps of pre-wetting (in which it is necessary to force water to enter the cavities), deposit of the insulating dielectric layer and filling (which require particular connections) on several substrata S plunged simultaneously into the same chemical bath B. The associated machines are also very bulky and require complex monitoring means due to the volumes of chemical baths B used.

On the contrary, by treating the substrata one after the other, a machine according to the invention considerably reduces the quantities of consumables used, and as a consequence the necessary footprint and the monitoring needs of the chemical baths B, therefore also reducing manufacturing costs per substrate treated according to a process according to the invention, and rapidly produces good-quality metallised substrata.

Of course, the present invention is not limited to the embodiments described hereinabove and illustrated in the diagrams, but the expert can make numerous variants and modifications thereto.

The invention claimed is:

1. A machine adapted to metallise a cavity of a semiconductive or conductive substrate, said substrate having a first active face on which said cavity is formed and a rear face opposite to said first face,
    wherein said machine comprises:
        at least one pre-wetting module for pre-wetting the substrate,
        at least one insulating dielectric layer depositing module for depositing an insulating dielectric layer,
        at least one barrier layer depositing module for depositing a barrier layer to diffusion,
        at least one filling module for filling said cavity by electrodeposition of a metal, and
        at least one annealing module for annealing the substrate,
    wherein each of said at least one pre-wetting modules, each of said at least one insulating dielectric layer depositing modules, each of said at least one barrier layer depositing modules, and each of said at least one filling modules comprises a container having a bottom and a support, each said container containing a liquid bath for immersing the substrate, said support being arranged horizontally at the bottom of each said container to receive said rear face of the substrate such that the active face of said substrate is oriented upwards in the direction opposite the bottom of each of the modules,
    such that the machine completes the entire metallisation process of the cavity.

2. The machine as claimed in claim 1, in which said support comprises arrangements to keep the substrate in position during the metallisation process.

3. The machine as claimed in claim 2, in which said support comprises a protection adapted to protect the rear face of the substrate, and in which the arrangements and the protection are formed by at least one channel adapted to create a vacuum between the support and the substrate.

4. The machine as claimed in claim 1, 2 or 3, in which the container of each of said at least one pre-wetting modules, said at least one insulating dielectric layer depositing modules, said at least one barrier layer depositing modules, and said at least one filling modules comprises lateral walls substantially adjacent to the support so as to limit the internal volume of said container.

5. The machine as claimed in claim 1, further comprising:
    at least one activation module for activating the barrier layer to diffusion, and
    at least one rinsing and drying module,
    wherein each of said at least one activation module and at least one rinsing and drying module comprises a container having a bottom, said container being adapted to contain a liquid bath in which the substrate is immersed and comprising a support, said support being arranged horizontally at the bottom of said container and adapted to receive said rear face of the substrate such that the active face of said substrate is oriented upwards in the direction opposite the bottom of the module.

6. The machine as claimed in claim 5, in which in each of said at least one pre-wetting modules, each of said at least one insulating dielectric layer depositing modules, each of said at least one barrier layer depositing modules, each of said at least one activation modules, each of said at least one filling modules and each of said at least one rinsing and drying modules, the substrate is movable between a first position, in which the support is adjacent to an opening of the corresponding module to allow placement of the substrate on the support, and a second position in which the support is lowered in the corresponding container through said opening so as to allow its treatment.

7. The machine as claimed in claim 5 or 6, in which at least one of the insulating dielectric layer depositing modules, the activation modules, the barrier layer depositing modules and the filling modules further comprises a device for rinsing and drying of the substrate.

8. The machine as claimed in claim 7, in which the device for rinsing and drying further comprises a motor to rotate the support about a central axis of said support and/or a nozzle to send inert gas onto the substrate to dry the substrate.

9. The machine as claimed in claim 8, in which at least one of the insulating dielectric layer depositing modules, the activation modules, the barrier layer depositing modules and the filling modules are arranged in a receptacle adapted to receive a rinsing fluid during rotation of the support.

10. The machine as claimed in claim 5 or 6, in which each of said at least one pre-wetting modules, said at least one insulating dielectric layer depositing modules, said at least one activation modules, said at least one barrier layer depositing modules, said at least one filling modules and said at least one rinsing and drying modules further comprises evacuation means adapted to enable at least partial evacuation of the liquid bath.

11. The machine as claimed in claim 10, in which the evacuation means comprise a tube extending from a lid of said modules adapted to at least partially aspirate the liquid bath, and/or a nozzle adapted to at least partially aspirate the liquid bath.

12. The machine as claimed in claim 5 or 6, further comprising a receptacle adapted to receive a cassette housing a plurality of substrates, and at least one robot to successively extract the substrates of the cassette and transfer them successively from one module to another to metallise at least one cavity of each of said substrates.

13. The machine as claimed in claim 5 or 6, in which each annealing module comprises:
    a container, at the bottom of which are arranged a plate forming a cold source and a plate forming a hot source intended to successively receive the substrate,
    an internal robot configured to have the substrate move from the cold source to the hot source, and
    a valve which operates to replace gas prevailing in the container by inert gas.

14. The machine as claimed in claim 5 or 6, in which each insulating dielectric layer depositing module comprises:
- a container which contains the liquid bath, at the bottom of which is arranged the support configured to receive the substrate,
- an anode comprising an inert metal arranged in the container,
- lighting comprising a source emitting light beams substantially uniformly over the entire surface of the substrate so as to activate the surface of the substrate,
- a power supply comprising connection means to the substrate and to the anode to polarise the surface of the substrate at an electric potential enabling electrochemical reaction, and
- a sealing joint, adapted to insulate the power supply from the electrolyte.

15. The machine as claimed in claim 14, in which each insulating dielectric layer depositing module further comprises rotation means of the anode relative to the support.

16. The machine as claimed in claim 5 or 6, in which each filling module comprises the support configured to receive the substrate and a motor adapted to set the support in rotation about a central axis of said support to evacuate part of the liquid bath.

17. The machine as claimed in claim 5 or 6, in which each filling module is further adapted to deposit on the barrier layer to diffusion a germination layer formed in the same metal as the filling layer.

18. The machine as claimed in claim 5 or 6, in which each filling module comprises:
- an anode, comprising an inert metal or a metal identical to that which is deposited during the filling of the cavity,
- a power supply comprising connection means to the barrier diffusion layer and to the anode to polarise the surface of the barrier diffusion layer at an electric potential enabling electrochemical reaction, and
- a sealing joint, adapted to insulate the power supply from the electrolyte.

19. The machine as claimed in claim 18, wherein the anode is rotatable relative to the support.

20. The machine as claimed in claim 5 or 6, in which each activation module and/or each barrier layer depositing module comprises:
- first heating adapted to heat the substrate to a temperature between 50° C. and 80° C., wherein said first heating is formed by the support configured to receive the substrate, and/or second heating adapted to heat the liquid bath in the container to a temperature of the order of 50° C. to 80° C.,
- an ultrasonic or megasonic transmitter, and
- a sealing joint, adapted to insulate a peripheral zone of the substrate from the liquid bath.

21. The machine as claimed in claim 5 or 6, in which each pre-wetting module comprises:
- a pump, adapted to create a vacuum in the container.

22. The machine as claimed in claim 1 or 5, wherein said substrate is a structure of the through silicon via type.

23. A metallisation process of a cavity of a semiconductive or conductive substrate, said process carried out with a machine as claimed in claim 1, comprising the steps of:
- a) depositing said insulating dielectric layer,
- b) depositing said barrier layer to diffusion of a filling metal,
- c) filling the cavity by said electrodeposition of said metal, and
- d) performing said annealing of the substrate.

24. The metallisation process as claimed in claim 23, successively comprising the following sub-steps:
- (i) a first pre-wetting of the substrate,
- (ii) depositing said insulating dielectric layer,
- (iii) a first rinsing and drying of the substrate,
- (iv) a first annealing of the substrate,
- (v) activating the barrier layer to diffusion of the metal,
- (vi) a second rinsing and drying of the substrate,
- (vii) depositing the barrier layer to diffusion of the filling metal,
- (viii) a third rinsing and drying of the substrate,
- (ix) a second pre-wetting of the substrate,
- (x) filling of the cavity by electrodeposition of the metal,
- (xi) a fourth rinsing and drying of the substrate, and
- (xii) a second annealing of the substrate.

25. The metallisation process as claimed in claim 24, further comprising a third annealing the substrate between the third rinsing and drying step of the substrate (viii) and the second pre-wetting step of the substrate (ix).

26. The metallisation process as claimed in claim 24 or claim 25, in which the first (iii), second (vi) and/or third (viii) rinsing and drying steps of the substrate are performed in the same module as said depositing said insulating dielectric layer (ii), said activating (v) and/or said depositing the barrier layer (vii) respectively.

27. The metallisation process as claimed in claim 26, in which at the start of said first pre-wetting (i), said depositing said insulating dielectric layer (ii), said first annealing (iv), said activating (v), said depositing the barrier layer (vii), and said second pre-wetting (ix), fixing the substrate on a corresponding container support by operation of a robot.

28. The metallisation process as claimed in claim 27, in which following said fixing of the substrate on the support, the process further comprises lowering the support in the module and closing the module.

29. The metallisation process as claimed in claim 28, in which on completion of said first pre-wetting (i), said depositing said insulating dielectric layer (ii), said first annealing (iv), said activating (v), said depositing the barrier layer (vii), and said second pre-wetting (ix), opening the module and raising the support so that the robot can extract the support from the module.

* * * * *